United States Patent
Olexenko

(10) Patent No.: US 7,859,312 B2
(45) Date of Patent: Dec. 28, 2010

(54) MULTIVALUED LOGIC CIRCUIT

(75) Inventor: Viktor Viktorovich Olexenko, Vladivostok (RU)

(73) Assignee: Virtual Pro Inc., Chicago, IL (US)

( * ) Notice: Subject to any disclaimer, the term of this patent is extended or adjusted under 35 U.S.C. 154(b) by 0 days.

(21) Appl. No.: 12/598,669

(22) PCT Filed: Apr. 30, 2008

(86) PCT No.: PCT/IB2008/051671

§ 371 (c)(1),
(2), (4) Date: Nov. 3, 2009

(87) PCT Pub. No.: WO2008/135914

PCT Pub. Date: Nov. 13, 2008

(65) Prior Publication Data

US 2010/0164596 A1    Jul. 1, 2010

(30) Foreign Application Priority Data

May 10, 2007    (RU) ............................... 2007117392

(51) Int. Cl.
*H03K 19/094* (2006.01)
(52) U.S. Cl. ......................................... 326/121; 326/82
(58) Field of Classification Search ............. 326/82–87, 326/112, 115, 119, 121
See application file for complete search history.

(56) References Cited

U.S. PATENT DOCUMENTS

| 4,229,803 A | 10/1980 | Rhodes |
| 4,814,644 A | 3/1989 | Yamakawa |
| 2005/0093629 A1 | 5/2005 | Nishimura et al. |
| 2006/0158227 A1* | 7/2006 | Guebels ....................... 326/126 |
| 2007/0279095 A1* | 12/2007 | Jiang ............................ 326/83 |
| 2009/0058464 A1* | 3/2009 | Kim et al. ...................... 326/68 |

FOREIGN PATENT DOCUMENTS

| RU | 2 176 850 C1 | 12/2001 |
| RU | 2 331 105 C1 | 8/2008 |

OTHER PUBLICATIONS

Current, "Current-mode CMOS quaternary threshold logic full adder circuit", International Journal of Electronics, Taylor and Francis, Ltd., London, GB, Apr. 1, 1993, vol. 74, No. 4, pp. 587-591, XP000365264.

* cited by examiner

*Primary Examiner*—Don P Le
(74) *Attorney, Agent, or Firm*—Birch, Stewart, Kolasch & Birch, LLP

(57) ABSTRACT

In a bridge adder circuit, a first and a second complementary pair of current mirrors is connected between the input terminals and a positive and a negative supply voltage bus, respectively, to control a first and a second push-pull output stage. The outputs of the push-pull output stages are connected to the respective inputs through first resistors and to a common output node through second resistors. As a result, a universal circuit element for a multivalued logic element, such as ternary logic or 5-valued logic is provided.

15 Claims, 2 Drawing Sheets

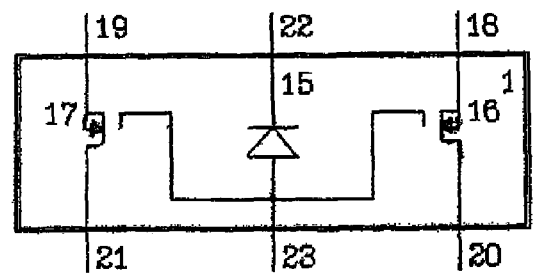
Fig. 3
|  | Signal state at input 12 | | |
|---|---|---|---|
|  | (+1) | (0) | (-1) |
| Signal state at input 11  (+1) | (-2) | (-1) | (0) |
| (0) | (-1) | (0) | (+1) |
| (-1) | (0) | (+1) | (+2) |
Fig. 4
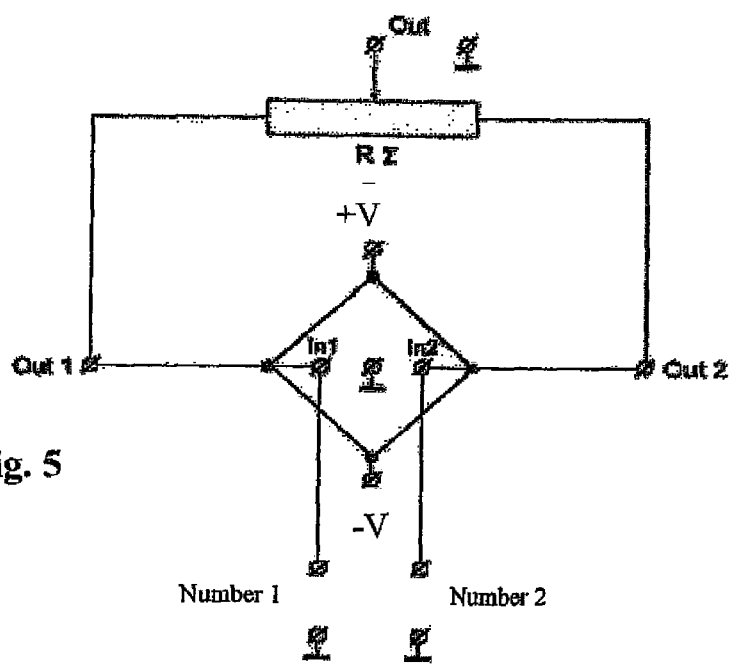
Fig. 5

MULTIVALUED LOGIC CIRCUIT

FIELD OF THE INVENTION

The invention relates generally to electronic logic circuits, and particularly to multivalued logic circuits that can have more than two defined logical states.

BACKGROUND OF THE INVENTION

The digital computing world is built on a structure of Boolean logic applied to binary values ("yes" or "no", one or zero, in or out), i.e. on two steady states (or signal ratings): symbolic zero, when a signal is absent and symbolic one, when a signal is present. Digital adders are typically based on binary logic. It is also known that some analog inversion adders form the algebraic sum of two and more input voltages, changing its polarity to opposite sign and they work based on the summation of signals using resistors at the inversion entrance of operational amplifier to obtain at the output of device a summarized resulted signal, taking into account phase and amplitude.

But this powerful structure is a gross oversimplification of the real world, where many shades of gray exist between black and white. In everyday life, we use quasimetric notions that are clearly related to numerical concepts or values but lack precision or demarcation. The real world simply does not map well to binary distinctions, and numerical precision is often unhelpful in making qualitative statements.

One approach proposed to resolve those situations, which could not be decided on the base of binary logic, is so-called fuzzy logic. The fuzzy logic approach to control problems mimics how a person would make decisions. In fuzzy systems, values are indicated by a number (called a truth value) in the range from 0 to 1, where 0.0 represents absolute falseness and 1.0 represents absolute truth. While this range evokes the idea of probability, fuzzy logic and fuzzy sets operate quite differently from probability.

Digital signal processing circuits are being implemented as large-scale-integrated (LSI) circuits on chips. Since the binary signals may assume only two states, the amount of information on the signal line interconnections carrying these signals is limited on the chips. If the circuits must process higher amounts of information, the number of metal line interconnections should be increase. However, the number of transistors and resistors, together with the number of metal signal line interconnections, that can be integrated on a chip of given size is limited by the conventional photomasking and silicon surface processing technology.

As an alternative to binary logic, multivalued logic is being considered for use on integrated circuits. The term "multivalued" is used herein to mean signals that may assume more than two states, i.e., three or more. For example, a quaternary or 4-valued logic circuit is a circuit that processes a signal that may assume any one of four states. A signal that may assume four states thus contains twice the amount of information of a binary signal which can assume only two states. Also artificial Intelligence (AI) would benefit from use of Aristotle's ternary logic, 3-valued (yes, don't know, no), or 5-value logic (exactly "yes", about "yes", don't know, about "no", exactly "no") which are often used by human beings instead of the simple binary logic ("yes", "no"). Multivalued logic circuits could be implemented with fewer interconnections than binary logic circuits, since each signal line can carry more information than binary logic circuits. Thus, with multivalued logic, the same number of signal lines used on a chip would provide higher signal processing capability than for a binary logic. Also Artificial Intelligence (AI) would benefit from use of multi-valued logic, such as the ternary logic, 3-valued (yes, don't know, no), or 5-value logic (exactly "yes", about "yes", don't know, about "no", exactly "no") which are often used by human beings instead of the simple binary logic ("yes", "no").

However, successful computer implementation of multi-valued logic, such as the ternary logic or 5-value logic has not been achieved yet due to the absence of effective, universal semiconductor elements with multiple (three or more) steady states.

Russian patent 2 176 850 disclose a low-noise wideband current amplifier with four current mirrors connected in series between positive and negative power supply lines. The outputs of the first current mirror is connected to the positive power supply line, and the outputs of the second current mirror, which is complementary to the first one, are connected to the negative power supply line. Each a pair of transistor whose control electrodes are connected to each other and to a voltage reference diode and whose other electrodes form two input and two output electrodes of the current mirror. In addition to the current mirrors, first and second complementary pairs of output transistors are also connected between the power supply such the common connection point of the series connected complementary output transistors in the first and second pair provide the first and the second output, respectively, of the amplifier. Between the first and the second current mirrors there are in series inserted the third and fourth current mirrors which are configured to be complementary to the first and second current mirrors, correspondingly. The first inputs of the third and fourth current mirrors are interconnected to form a first input of the amplifier, and the second inputs of the third and fourth current mirrors are interconnected to form a second input of the amplifier. The first and second outputs of the third current mirror is connected to the respective inputs of the first current mirror and to the control electrodes of first output transistors in the first and second complementary pairs, and the outputs of the fourth current mirror is connected to the respective inputs of the second current mirror and to the control electrodes of second complementary output transistors in the first and second complementary pairs. The resulting amplifier circuit can have three steady states at every output thereof (+V, 0, −V).

BRIEF DESCRIPTION [DISCLOSURE] OF THE INVENTION

An object of the present invention to provide a universal multivalued logic element. The object of the invention are achieved by a logic circuit according to the independent claims. The preferred embodiments of the invention are disclosed in the dependent claims.

According to an aspect of the invention, an adder circuit is provided, comprising a first input terminal, a second input terminal, and an output terminal, a first supply voltage line and a second supply voltage line, a first complementary pair of first and second output transistors operationally connected between the first and second supply voltage lines (9,10), a second complementary pair of third and fourth output transistors operationally connected between the first and second supply voltage lines, a first complementary pair of current mirrors operationally connected between to the input terminals and the first supply voltage line to provide control signals for control electrodes of the first output transistor and the third output transistor, a second complementary pair of current mirrors operationally connected between to the input terminals and the second supply voltage line to provide control signals for control electrodes of the second output transistor and the fourth output transistor, and at least one first resistive device operationally connected between a first intermediate node in the first complementary output transistor pair and the output terminal, and at least one second resistive device operationally connected between a second intermediate node in the second complementary output transistor pair and the output terminal.

According to an embodiment of the invention, the first and second complementary pairs of current mirrors comprise a first current mirror having a pair of inputs operationally connected to the first supply voltage line (9) and a pair of outputs, a second complementary current mirror having a pair of inputs (18,19) operationally connected to the first supply voltage line and a pair of outputs, a third complementary current mirror having a pair of inputs operationally connected to the first and second input terminals and a pair of outputs operationally connected to the outputs of the first current mirror and further to the control electrodes of the first and third output transistors, respectively, a fourth current mirror having a pair of inputs operationally connected to the first and second input terminals and a pair of outputs operationally connected to the outputs of the second current mirror and further to the control electrodes of the second and fourth output transistors, respectively, a third complementary current mirror having a pair of inputs operationally connected to the first and second input terminals and a pair of outputs connected to the control electrodes of the second and fourth output transistors, respectively, and a fourth current mirror having a pair of inputs operationally connected to outputs of the third current mirror and a pair of outputs of operationally connected to the second supply voltage line.

According to an embodiment of the invention, a third resistive device is operationally connected between the first input terminal and the first intermediate node, and a fourth resistive device is operationally connected between the second input terminal and the second intermediate node.

According to an embodiment of the invention, each current mirror comprises a first transistor device operationally connected between first one of the inputs and first one of the outputs of the respective current mirror, and a second transistor device operationally connected between second one of the inputs and second one of the outputs of the respective current mirror, the control electrodes of the first and second transistor devices being operationally connected to a common potential.

According to an embodiment of the invention, each current mirror comprises a reference voltage input and a reference voltage output providing said common potential which is derived through a forward biased diode device from the reference voltage input.

According to an embodiment of the invention, the adder circuit is on an integrated circuit chip.

Another aspect of the invention is a n integrated circuit comprising one or more adder circuits according to embodiments of the inventions.

Embodiments of the present invention allow to create a universal (basic) multivalued logic element different from binary Boolean logic, such as ternary logic ("yes", "don't know", "no"), or 5-valued logic of artificial intelligence (exactly "yes", about "yes", "don't know", about "no", exactly "no"), and to use it in analog or digital electronics, as well as in automatics, gauges for measurement, and computing machines.

Utilization of embodiments of the present invention in computer applications that are based on logic different from Boolean binary logic may allow various advantages, including:

high protection against software viruses, because in ternary or in 5-value logic the harmful software is much easier to identify and safely delete or isolate;

increased speed of computer operations, due to the capability of performing complex mathematical calculations including negative digits (currently, each negative number requires one extra bit of data);

increased computer operation stability: in case of program failure, it would not buzz, as it often happens in binary logic (that is provoked by the absence of "don't know" state and contradiction of "yes" and "no" states), and therefore the computer does not need to be reset losing useful information. With an adder according to embodiment of the invention, a computer will continue to work even if the other program is waiting for intermediate decision for sub-program, having given failure. Moreover, ternary or 5-value logics are the most convenient to compile a program based on Russian language, that brings a great opportunity to use such computer for Russian speaking users;

cybernetic appliances can be created (including respectively software) with elements of artificial intelligence, that in its turn would significantly simplify work with such computer, i.e. the home computer could be converted into the electronic expert;

new generation of electronic technical systems of different destination with elements of artificial intelligence can be created, such as a software that provides new functional quality and marketability of manufactured product;

a reliable analog-digital electronic computing machines with elements of artificial intelligence can be created, working in real-time mode (aircraft autopilot, for example).

BRIEF DESCRIPTION OF THE DRAWINGS

In the following the invention will be described in greater detail by means of exemplary embodiments with reference to the attached drawings, in which

FIG. 3 shows a schematic diagram of a current mirror according to another exemplary embodiment of the invention;

FIG. 4 shows a table illustrating the mapping between the input states and the output states of an adder according to an embodiment of the invention; and FIG. 5 illustrates the bridge-type operation of the adder according to an embodiment of the invention.

DETAILED DESCRIPTION OF THE INVENTION

Figure 1:
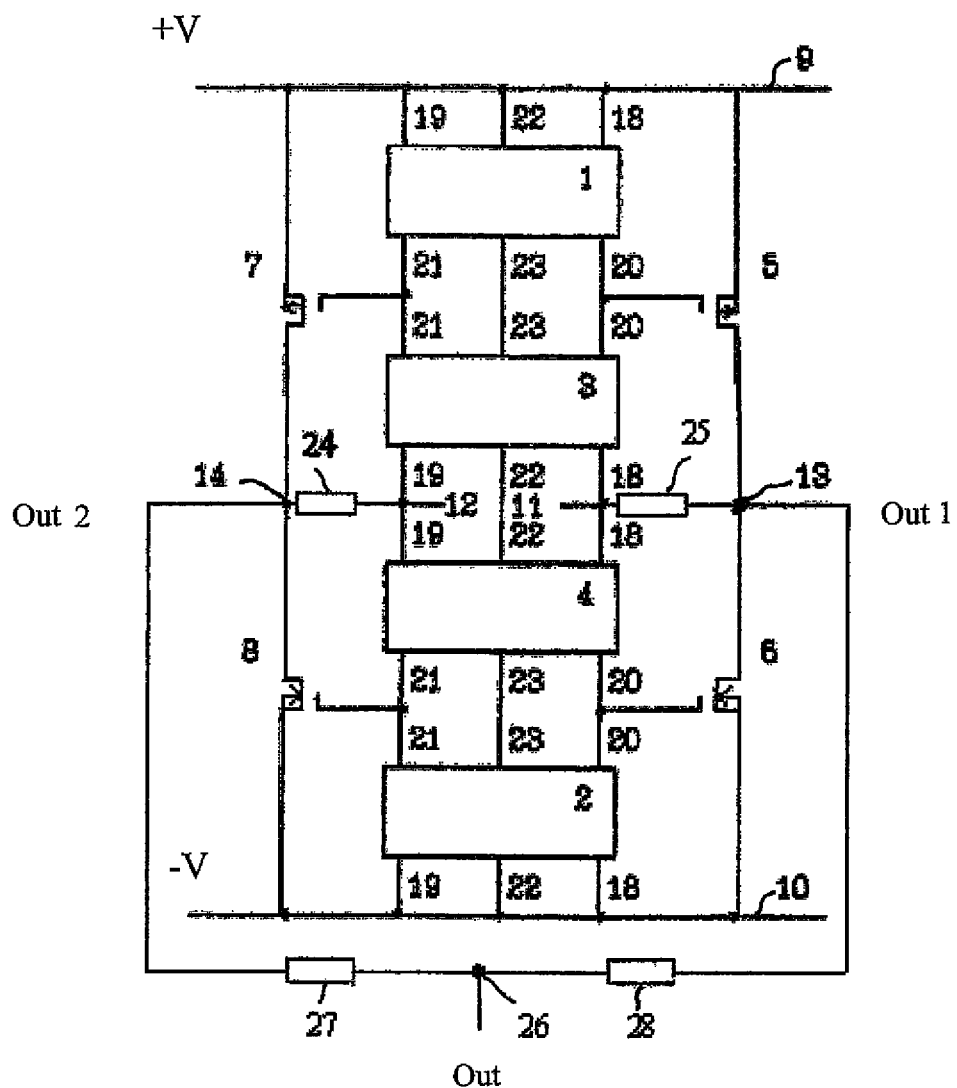
FIG. 1 illustrates an universal bridge adder circuit according to an exemplary embodiment of the invention.

A universal bridge adder circuit according to an exemplary embodiment of the invention is illustrated in FIG. 1. The adder circuit contains current mirrors 1, 2, 3 and 4, output transistors 5, 6, 7, and 8, a power supply bus 9 for a positive supply voltage, a power supply bus for a negative supply voltage, input terminals 11 and 12, and intermediate output nodes 13 and 14, as well as an adder output terminal 26. As used herein, the positive and negative supply voltages refer to the mutual relationship of the voltages, i.e. both voltages may be of the same polarity (+ or −, or +/− and 0). In preferred embodiments, the supply voltages are of equal value but opposite polarities, e.g. +5V and −5V.

Figure 2:
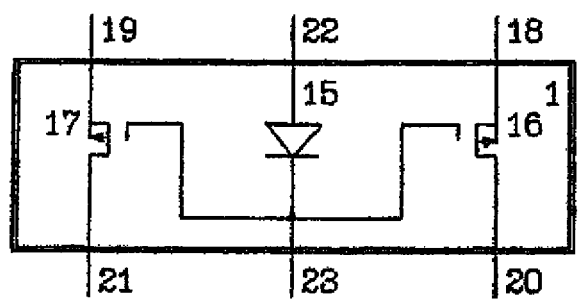
FIG. 2 shows a schematic diagram of a current mirror according to an exemplary embodiment of the invention.

According to an embodiment of the invention, each current mirror 1, 2, 3, and 4 may contain, for instance, a pair of input electrodes 18 and 19, a pair of output electrodes 20 and 21, a control input electrode 22, and a control output output electrode 23. A schematic diagram of a current mirror according to an exemplary embodiment of the invention is shown in FIG. 2. This current mirror is applicable for current mirrors 1 and 4 in FIG. 1. The source and drain electrodes of a transistor device 16, such as a N-type MOSFET may be connected to the input 18 and the output 20, respectively. Similarly, the source and drain electrodes of a transistor device 17, such as a N-type MOSFET may be connected to the input 19 and the output 21, respectively. A voltage reference generating device, such as a diode 15 may be connected between the control input electrode 22 and the control output electrode 23. The diode may be implemented in any suitable way, e.g. with a transistor connected to operate as a diode. The gate electrodes of the transistor devices 16 and 17 are connected to the control output electrode 23 and thereby to the common reference voltage provided by the diode 15. An exemplary schematic diagram of a complementary current mirror that is suitable for current mirrors 2 and 3 are illustrated in FIG. 3. The complementary current mirror is similar to that shown in FIG. 2, except that the transistor device 16 and 17 may now be P-type transistor devices, such MOSFETs. It should be appreciated that the implementation of the current mirrors is not intended to be restricted to the specific examples shown but various alternative current mirror designs may be used instead without departing from the scope of the present invention.

Referring again to FIG. 1, the current mirrors 1 and 3 are connected as a complementary pair between the input terminals 11, 12 and the positive supply voltage bus 9. More specifically, the input electrodes 18 and 19 of the current mirror 3 are connected to the input terminals 11 and 12, respectively. The input electrodes 18 and 19, as well as the control input 22 of the current mirror 1 are connected to the positive supply voltage bus 9. The output electrodes 20, 21 and 23 of current mirror 1 are connected to the respective output electrodes 20, 21 and 23 of current mirror 3.

Similarly, the current mirrors 2 and 4 are connected as a complementary pair between the input terminals 11, 12 and the negative supply voltage bus 10. More specifically, the input electrodes 18 and 19 of the current mirror 4 are connected to the input terminals 11 and 12, respectively. The input electrodes 18 and 19, as well as the control input 22 of the current mirror 2 are connected to the negative supply voltage bus 10. The output electrodes 20, 21 and 23 of current mirror 2 are connected to the respective output electrodes 20, 21 and 23 of current mirror 4. The control input electrodes 22 of the current mirrors 3 and 4 are interconnected.

A first complementary pair of N-type output transistor 5 and a complementary P-type transistor 6 is provided in series connection between the positive supply voltage bus 9 and the negative supply voltage bus 10 to form a push-pull type output stage. The first intermediate output node 13 is at the common node which the drains of the transistors 5 and 6 are connected to. The gate electrode of the output transistor 5 is connected to the interconnected outputs 20 of the current mirrors 1 and 3, and the gate electrode of the output transistor 6 is connected to the interconnected outputs 20 of the current mirrors 2 and 4.

Similarly, a second complementary pair of N-type output transistor 7 and a complementary P-type transistor 8 is provided in series connection between the positive supply voltage bus 9 and the negative supply voltage bus 10 to form a push-pull type output stage. The second intermediate output node 14 is at the common node which the drains of the transistors 5 and 6 are connected to. The gate electrode of the output transistor 7 is connected to the interconnected outputs 21 of the current mirrors 1 and 3, and the gate electrode of the output transistor 8 is connected to the interconnected outputs 21 of the current mirrors 2 and 4.

The first intermediate output node 13 from the first push-pull output stage 5, 6 may be connected via a resistive element(s), such as a resistor 28, to the common output terminal 26 of the adder. Similarly, the second intermediate output node 14 from the first push-pull output stage 7, 8 may be connected via a resistive element(s), such as a resistor 27, to the common output terminal 26 of the adder.

The input 11 is connected to the first intermediate output node 13 via a resistive element(s), such as a resistor 25. The input 12 is connected to the first intermediate output node 14 via a resistive element(s), such as a resistor 24.

It should be appreciated that the invention is not intended to be restricted to the specific examples illustrated herein. Particularly, there may be various additional components or devices, and/or more complicated interconnections, without departing the principles of the present invention. For example, there are various alternative ways to implement the output transistor stages.

The universal adder circuit according to the exemplary embodiment of the invention operates in the following way. An input signal corresponding to a number N1 is inputted to the input terminal 11, and an input signal corresponding to a number N2 is inputted to the input terminal 12. The input signals N1 and N2 may have states +1, 0, −1.

The input signals N1 and N2 are applied from input terminals 11 and 12 (FIG. 1) to the inputs 18 and 19, respectively, of the current mirrors 3 and 4. The signals N1 and N2 at the inputs 18 and 19 are transferred through the current mirrors 3 and 4 to the outputs 20 and 21. The signals at the outputs 20 and 21 control the gate electrodes of the output complementary transistors 5, 6, 7, and 8. As a result, when N1 has state +1, the transistor 6 is switched on and the transistor 5 is switched off, and the current −I flows through the transistor 6 and resistor 28. When N1 has state −1, the transistor 6 is switched off and the transistor 5 is switched on, and the current +I flows through the transistor 5 and resistor 28. When N1 has state 0, both transistors 5 and 6 are switched off, and no current flows through resistor 28. Similarly, when N2 has state +1, the transistor 8 is switched on and the transistor 7 is switched off, and the current −I flows through the transistor 8 and resistor 27. When N2 has state −1, the transistor 8 is switched off and the transistor 7 is switched on, and the current +I flows through the transistor 7 and resistor 27. When N2 has state 0, both transistors 7 and 8 are switched off, and no current flows through resistor 27. The bridge-type nature of the adder is illustrated schematically in FIG. 5. The currents flowing through the resistors 27 and 28, and the voltages across the resistors 27 and 28, are summed at the output terminal 26, resulting in one of five states +2, +1, 0, −1, and −2 depending on the states of the input signals N1 and N2. In other words, the output state is an inverted sum of the input states. The mapping between the input states and the output states is illustrated in FIG. 4. The resulting signal (output 26)

appears on the crossing of lines (number N1 at the input 11) and columns (number N2 at the input 12) as follows:

output state (+2)–output voltage +V; (exactly yes/no)
output state (+1)–output voltage ±V/2; (about yes/no)
output state (0)–output voltage 0; (don't know)
output state (−1)–output voltage −V/2; (about no/yes)
output state (−2)–output voltage −V; (exactly no/yes).

It should be appreciated that the states or rating given in parenthesis in the above example are approximate (symbolic) and depend on technology peculiarities of the adder specific design.

The summing result is obtained as one of 5 (five) steady symbolic signal ratings or states (therefore they are readily reproduced), which are suitable for realization of any multi-valued logic that is different from Boolean binary logic, for example, for example ternary logic ("yes", "don't know", "no"), or for 5 valued logic of artificial intelligence (exactly "yes", about "yes", "don't know", about "no", exactly "no").

Various embodiments of the invention may be implemented on integrated circuit chip with any suitable manufacturing technology, such as SOI (silicon on insulator), MOS (metal on silicon), or CMOS (complementary metal on silicon).

Adder circuits according to embodiments of the invention may be employed as universal electronic elements in various analog or digital electronic computing devices, particularly in those with artificial intelligence capability. Application areas may include:

a) home electronic appliances, telephone, cell-phone, etc., devices for communication:
   photo cameras and video cameras for work at scarce luminosity;
   analog-digital converter for computer engineering;
   audio-video systems, radio-receivers and radio-management device;
   basic appliance of artificial intellect;
   personal computers with artificial intellect;
   radio-receivers and radio-operation appliances;
   radio-stations, radio-telephones, fax apparatus, etc.;
   television engineering and satellite antennae for it.

b) communication systems with the elements of artificial intelligence:
   apparatus supply of telecommunication systems: architecture, element base, microprocessor units, personal computers, operational stations servers, telecommunication facilities, peripheral equipment, electronic calculating machines, multiprocessor complexes;
   information systems;
   software supply of telecommunication systems: operational systems, software for systems, applied software production, instrumentation for software, outsourcing;
   communication: fiber-optic, wireless communication (cell-phone, underwater, space communication), etc.

c) ocean engineering:
   submersible cameras for sub-sea video survey to photograph under low rate of luminosity;
   non-linear echo sounders and prophilographers used for search of mineral resources, oozed pipelines till the depth of a few hundreds meters;
   linear sonars (hydrolocators) for round and sectorial surveillance;
   side-looking sonars linear and non-linear ones;
   compact on-board computing complex for autonomous undersea apparatus;
   underwater television and communication between underwater objects;
   multiple communication between divers.

d) geophysical research:
   prognosis of earthquakes, detection of cracks and fissures in the crust, mineral resources deposits and wells, scanning of underground noises of different nature, shifts in the earth crust and instrumental measurements of them using laser interferometers;
   various measuring and specialized apparatus.

e) medical and diagnostic purposes:
   acoustic and ultra-sonic examination apparatus, ultrasonic scanners, computer and nuclear magnetic tomographers, other diagnostic apparatus.

f) other fields:
   scientific research apparatus (including nanotechnology) and experimental testing;
   navigational positioning, aviation, aerospace, including control of activity of remotely operated aerospace robotics;
   radio-location apparatus, including the system for detection of low flying objects and radio-astronomy;
   special electronic devices for search, special destination, supersensitive and utmost precise directed microphones, devices for anti-terrorist destination, etc.

Even though the invention has been described above with reference to an example according to the accompanying drawings, it is clear that the invention is not restricted thereto but it can be modified in several ways within the scope of the appended claims.

The invention claimed is:

1. An adder circuit, comprising
   a first input terminal, a second input terminal, and an output terminal,
   a first supply voltage line and a second supply voltage line,
   a first complementary pair of first and second output transistors operationally connected between the first and second supply voltage lines,
   a second complementary pair of third and fourth output transistors operationally connected between the first and second supply voltage lines,
   a first complementary pair of current mirrors operationally connected between to the input terminals and the first supply voltage line to provide control signals for control electrodes of the first output transistor and the third output transistor,
   a second complementary pair of current mirrors operationally connected between to the input terminals and the second supply voltage line to provide control signals for control electrodes of the second output transistor and the fourth output transistor, and
   at least one first resistive device operationally connected between a first intermediate node in the first complementary output transistor pair and the output terminal, and at least one second resistive device operationally connected between a second intermediate node in the second complementary output transistor pair and the output terminal.

2. An adder circuit as claimed in claim 1, wherein the first and second complementary pairs of current mirrors comprise
   a first current mirror having a pair of inputs operationally connected to the first supply voltage line and a pair of outputs,
   a second complementary current mirror having a pair of inputs operationally connected to the first supply voltage line and a pair of outputs,
   a third complementary current mirror having a pair of inputs operationally connected to the first and second input terminals and a pair of outputs operationally connected to the outputs of the first current mirror and further to the control electrodes of the first and third output transistors, respectively, a fourth current mirror having a pair of inputs operationally connected to the first and second input terminals and a pair of outputs operationally connected to the outputs of the second current mirror and further to the control electrodes of the second and fourth output transistors, respectively, a third complementary current mirror having a pair of inputs operationally connected to the first and second input terminals and a pair of outputs connected to the control electrodes of the second and fourth output transistors, respectively, and a fourth current mirror having a pair of inputs operationally connected to outputs of the third current mirror and a pair of outputs of operationally connected to the second supply voltage line.

3. An adder circuit as claimed in claim 1, further comprising a third resistive device operationally connected between the first input terminal and the first intermediate node, and a fourth resistive device operationally connected between the second input terminal and the second intermediate node.

4. An adder circuit as claimed in claim 1, wherein each current mirror comprises a first transistor device operationally connected between first one of the inputs and first one of the outputs of the respective current mirror, and a second transistor device operationally connected between second one of the inputs and second one of the outputs of the respective current mirror, the control electrodes of the first and second transistor devices being operationally connected to a common potential.

5. An adder circuit as claimed in claim 4, wherein each current mirror comprises a reference voltage input and a reference voltage output providing said common potential which is derived through a forward biased diode device from the reference voltage input.

6. An adder circuit as claimed in claim 1, wherein said circuit is on an integrated circuit chip.

7. An adder circuit as claimed in claim 2, wherein each current mirror comprises a first transistor device operationally connected between first one of the inputs and first one of the outputs of the respective current mirror, and a second transistor device operationally connected between second one of the inputs and second one of the outputs of the respective current mirror, the control electrodes of the first and second transistor devices being operationally connected to a common potential.

8. An adder circuit as claimed in claim 7, wherein each current mirror comprises a reference voltage input and a reference voltage output providing said common potential which is derived through a forward biased diode device from the reference voltage input.

9. An integrated circuit comprising one or more adder circuits, at least one of said one or more adder circuits further comprising a first input terminal, a second input terminal, and an output terminal, a first supply voltage line and a second supply voltage line, a first complementary pair of first and second output transistors operationally connected between the first and second supply voltage lines, a second complementary pair of third and fourth output transistors operationally connected between the first and second supply voltage lines, a first complementary pair of current mirrors operationally connected between to the input terminals and the first supply voltage line to provide control signals for control electrodes of the first output transistor and the third output transistor, a second complementary pair of current mirrors operationally connected between to the input terminals and the second supply voltage line to provide control signals for control electrodes of the second output transistor and the fourth output transistor, and at least one first resistive device operationally connected between a first intermediate node in the first complementary output transistor pair and the output terminal, and at least one second resistive device operationally connected between a second intermediate node in the second complementary output transistor pair and the output terminal.

10. An integrated circuit as claimed in claim 9, wherein the first and second complementary pairs of current mirrors comprise a first current mirror having a pair of inputs operationally connected to the first supply voltage line and a pair of outputs, a second complementary current mirror having a pair of inputs operationally connected to the first supply voltage line and a pair of outputs, a third complementary current mirror having a pair of inputs operationally connected to the first and second input terminals and a pair of outputs operationally connected to the outputs of the first current mirror and further to the control electrodes of the first and third output transistors, respectively, a fourth current mirror having a pair of inputs operationally connected to the first and second input terminals and a pair of outputs operation-ally connected to the outputs of the second current mirror and further to the control electrodes of the second and fourth output transistors, respectively, a third complementary current mirror having a pair of inputs operationally connected to the first and second input terminals and a pair of outputs connected to the control electrodes of the second and fourth output transistors, respectively, and a fourth current mirror having a pair of inputs operationally connected to outputs of the third current mirror and a pair of outputs of operationally connected to the second supply voltage line.

11. An integrated circuit as claimed in claim 9, further comprising a third resistive device operationally connected between the first input terminal and the first intermediate node, and a fourth resistive device operationally connected between the second input terminal and the second intermediate node.

12. An integrated circuit as claimed in claim 9, wherein each current mirror comprises a first transistor device operationally connected between first one of the inputs and first one of the outputs of the respective current mirror, and a second transistor device operationally connected between second one of the inputs and second one of the outputs of the respective current mirror, the control electrodes of the first and second transistor devices being operationally connected to a common potential.

13. An integrated circuit in claim 12, wherein each current mirror comprises a reference voltage input and a reference voltage output providing said common potential which is derived through a forward biased diode device from the reference voltage input.

14. An integrated circuit as claimed in claim 10, wherein each current mirror comprises a first transistor device operationally connected between first one of the inputs and first one of the outputs of the respective current mirror, and a second transistor device operationally connected between second one of the inputs and second one of the outputs of the respective current mirror, the control electrodes of the first and second transistor devices being operationally connected to a common potential.

15. An integrated circuit in claim 14, wherein each current mirror comprises a reference voltage input and a reference voltage output providing said common potential which is derived through a forward biased diode device from the reference voltage input.

* * * * *